(12) United States Patent
Li

(10) Patent No.: US 7,812,463 B2
(45) Date of Patent: Oct. 12, 2010

(54) PACKAGING INTEGRATED CIRCUITS FOR HIGH STRESS ENVIRONMENTS

(75) Inventor: Felix C. Li, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 116 days.

(21) Appl. No.: 12/171,189

(22) Filed: Jul. 10, 2008

(65) Prior Publication Data

US 2010/0006991 A1      Jan. 14, 2010

(51) Int. Cl.
*H01L 23/29* (2006.01)
(52) U.S. Cl. ............... 257/790; 257/669; 257/674; 257/701; 257/729; 257/E23.031; 257/E23.112; 257/E23.126
(58) Field of Classification Search ............ 257/666, 257/E23.031, 669, 674, 729, 790, E23.112, 257/E23.126
See application file for complete search history.

(56) References Cited

U.S. PATENT DOCUMENTS

| | | | | |
|---|---|---|---|---|
| 4,728,698 A | * | 3/1988 | Isayev et al. | ............ 525/439 |
| 5,150,195 A | * | 9/1992 | Nguyen | ............ 257/783 |
| 5,434,105 A | | 7/1995 | Liou | |
| 5,698,899 A | * | 12/1997 | Hirakawa et al. | ............ 257/712 |
| 5,970,322 A | * | 10/1999 | Ichikawa et al. | ............ 438/124 |
| 6,091,157 A | * | 7/2000 | Black et al. | ............ 257/790 |
| 2004/0026776 A1 | * | 2/2004 | Brand | ............ 257/706 |
| 2004/0065945 A1 | * | 4/2004 | Smith | ............ 257/666 |
| 2004/0232603 A1 | * | 11/2004 | Yoshikawa et al. | ............ 264/564 |

FOREIGN PATENT DOCUMENTS

JP          01-220465       *   9/1989  ................ 257/790

OTHER PUBLICATIONS

U.S. Appl. No. 11/621,063, filed Jan. 8, 2007.

\* cited by examiner

*Primary Examiner*—Wael M Fahmy
*Assistant Examiner*—John C Ingham
(74) *Attorney, Agent, or Firm*—Beyer Law Group LLP

(57) ABSTRACT

One aspect of the invention pertains to a semiconductor package suitable for use in high stress environments, such as ones involving high pressures, temperatures and/or corrosive substances. In this aspect, a die and leadframe are fully encapsulated in a first plastic casing. The first plastic casing is fully encapsulated in turn with a second plastic casing. The two casings have different compositions. The first plastic casing, for example, may be made of a thermoset plastic material and the second plastic casing may be made of a thermoplastic material. The first plastic casing may have recesses, indentations and/or slots suitable for securing it to the second plastic casing. In some embodiments, a corrosion resistant coating is added to the second plastic casing. Methods for forming semiconductor packages suitable for use in high stress environments are also described.

17 Claims, 4 Drawing Sheets

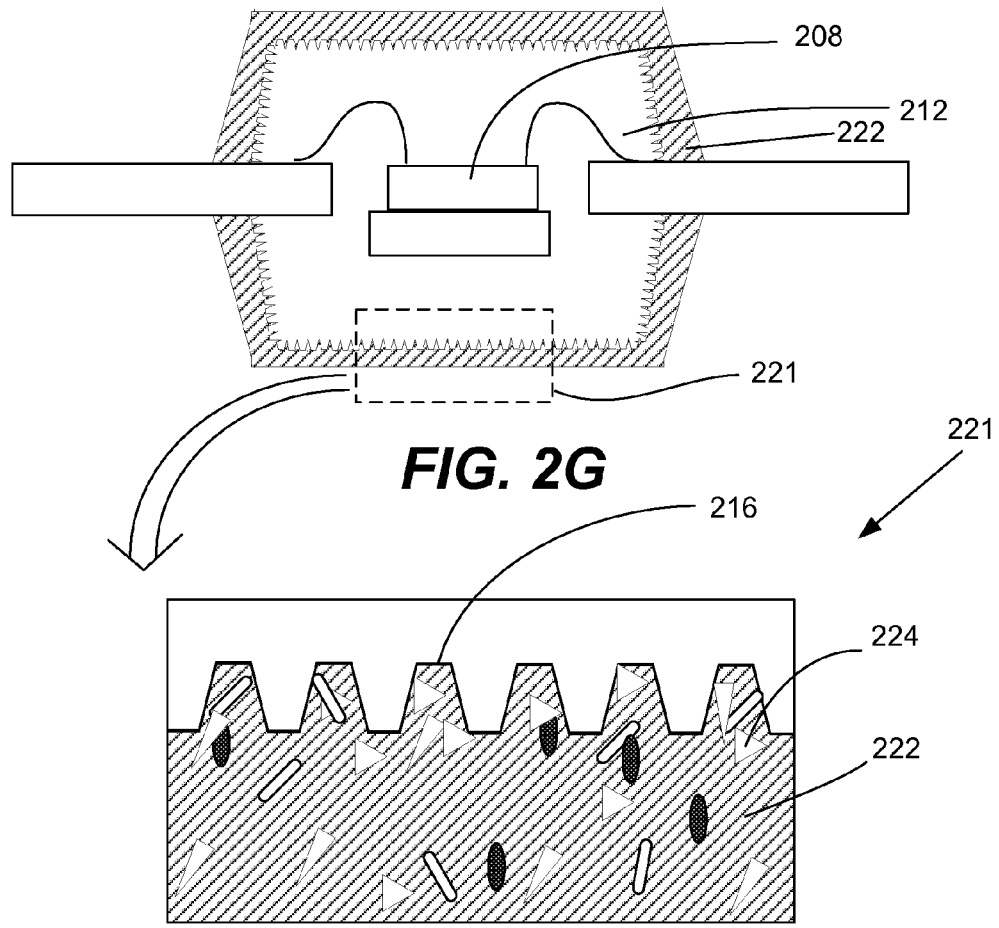
FIG. 2G
FIG. 2H
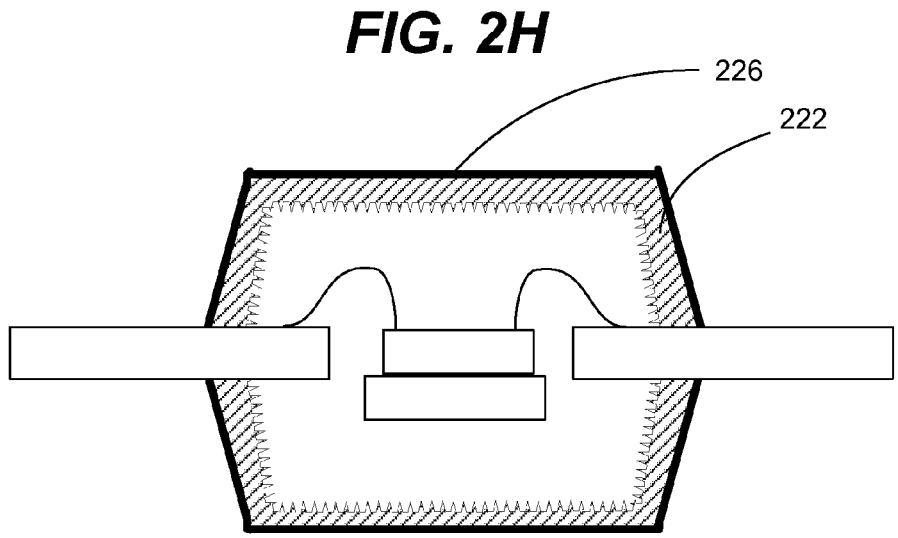
FIG. 2I

PACKAGING INTEGRATED CIRCUITS FOR HIGH STRESS ENVIRONMENTS

BACKGROUND OF THE INVENTION

The present invention relates generally to the packaging of integrated circuits (ICs). More particularly, the present invention relates to packaging integrated circuits suitable for use in high stress environments involving, for example, corrosive substances, prolonged vibration and/or high temperatures and pressures.

Various commercial and military applications require IC devices capable of functioning in such environments. Petroleum drilling, for example, may involve positioning sensors tens of thousands of feet below the surface, where conditions can be exceptionally harsh. Such sensors must be adequately protected to ensure their continued operation.

There are a number of conventional processes for packaging and protecting integrated circuits. Many packaging techniques involve encasing portions of an IC die and leadframe with a material such as plastic, ceramic or metal. Plastic is typically used for standard applications, while ceramic and metal are often used to protect IC devices operating under more challenging conditions.

Although ceramic and metallic packages work well in many situations, they also have drawbacks. Ceramic and metallic packages, for example, are typically more expensive than plastic ones. Thus, there are ongoing efforts to protect integrated circuit devices in a more cost-effective manner.

SUMMARY OF THE INVENTION

In one aspect of the present invention, a semiconductor package suitable for use in high stress environments is described. In this aspect, a die and leadframe are fully encapsulated in a first plastic casing. The first plastic casing in turn is fully encapsulated by a second plastic casing. The two casings have different compositions. In some embodiments, the first plastic casing is made of a thermoset plastic material and the second plastic casing is made of a thermoplastic material, such as a liquid crystal polymer. The first plastic casing may have recesses, indentations and/or slots on its surface for interlocking with the second plastic casing. A corrosion resistant coating may be added to the exterior of the second plastic casing. These layers help protect the encased semiconductor device from vibration, corrosive substances and temperature extremes.

In various embodiments, the plastic casings are fabricated and structured in different ways. The first and second plastic casings may be formed by transfer molding and injection molding, respectively. In some embodiments, recesses on the first plastic casing have a depth of approximately 0.2 to 0.3 millimeters. The recesses on the first plastic casing may be partially or completely filled by the second plastic casing In some embodiments of the invention, the filler material in the second plastic casing may be irregularly shaped and have a glass transition temperature ($T_g$) that is less than the $T_g$ of the second plastic casing. The filler material may be designed to enter recesses on the first plastic casing and secure the first and second plastic casings to one another. In some embodiments, the edges of the filler material in the first plastic casing are less sharp than the edges of the filler material in the second plastic casing. The filler material in the second plastic casing may include amorphous polymer chains. In some embodiments, the first plastic casing has a $T_g$ no greater than approximately 175° C. The second plastic casing can be designed to have a melting temperature of at least approximately 220° C.

Some embodiments relate to methods of forming packages suitable for use in high-stress environments, such as the packages described above.

BRIEF DESCRIPTION OF THE DRAWINGS

The invention and the advantages thereof, may best be understood by reference to the following description taken in conjunction with the accompanying drawings in which:

FIG. 2G is a diagrammatic side view of the structures illustrated in FIG. 2C after their encapsulation in a second plastic casing.

FIG. 2H is an enlarged view of a portion of FIG. 2G, showing how the recesses and the second plastic casing interlock according to one embodiment of the present invention.

FIG. 2I is a diagrammatic side view of the structures illustrated in FIG. 2G after a corrosion resistant coating has been applied to the surface of the second plastic casing.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. As explained in the background section, certain applications require integrated circuits that can operate for extended periods under unusually harsh conditions. Such conditions include the presence of corrosive substances, intense pressures and temperatures, and prolonged vibration. Integrated circuits exposed to these conditions need to be adequately insulated and protected.

Figure 1:
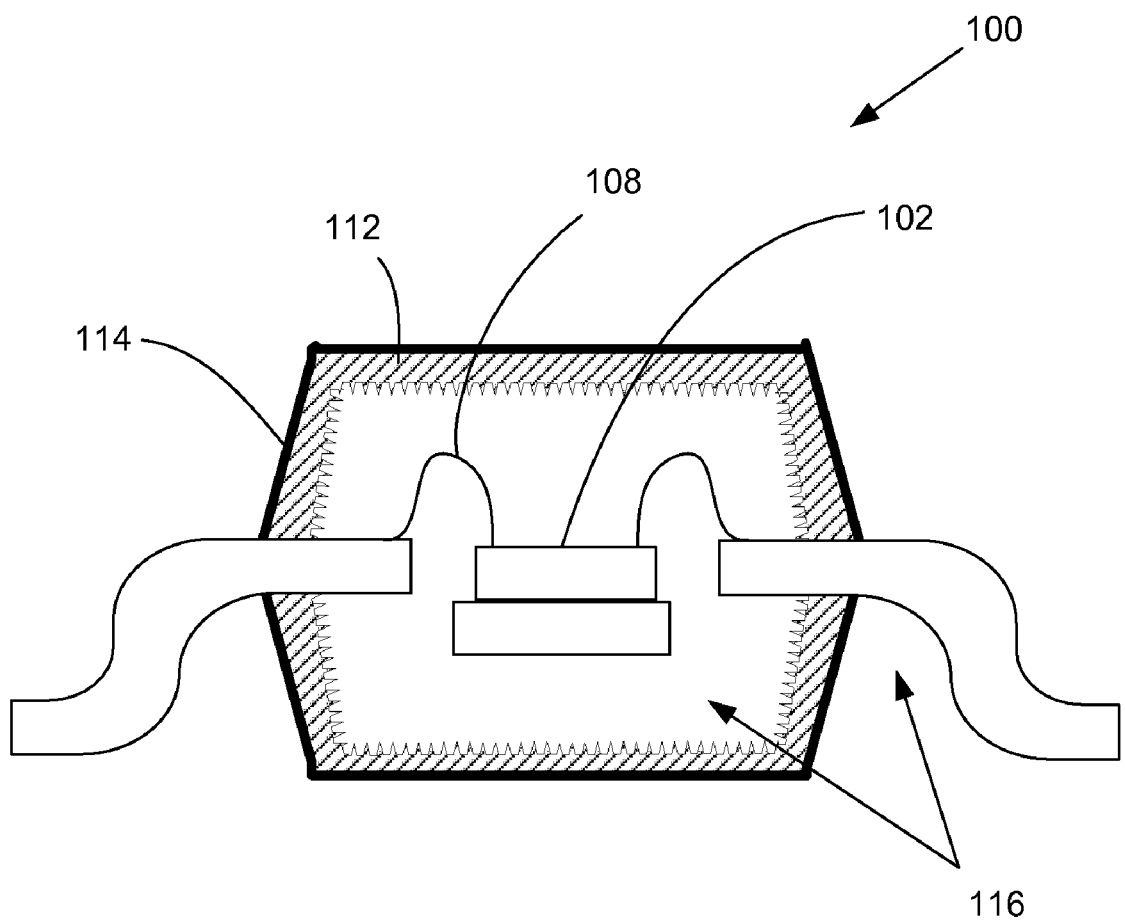
FIG. 1 is a diagrammatic side view of a semiconductor package suitable for high stress environments according to one embodiment of the present invention.

Referring next to FIG. 1, one embodiment of the present invention is described. FIG. 1 diagrammatically illustrates semiconductor package 100 adapted for use in high stress environments. Package 100, which includes integrated circuit die 102 and leadframe 116, has several different layers that provide protection against heat, corrosion and vibration. In the illustrated embodiment, integrated circuit die 102 is fully encapsulated in first plastic casing 108. First plastic casing 108 is in turn fully encapsulated by second plastic casing 112, which is coated with corrosion resistant coating 114.

In the illustrated embodiment, first plastic casing 108 has a composition different from that of second plastic casing 112. First plastic casing 108, for example, is made of a thermoset plastic material, while second plastic casing 112 is made of a thermoplastic material. Additionally, the surface of first plastic casing 108 has recesses 110, which promotes the interlocking of the first and second casings. Second plastic casing 112 incorporates irregularly shaped, sharp-edged filler material (not shown) that further facilitates such interlocking. These features will be discussed in connection with FIGS. 2A-2I below.

Figure 2A:
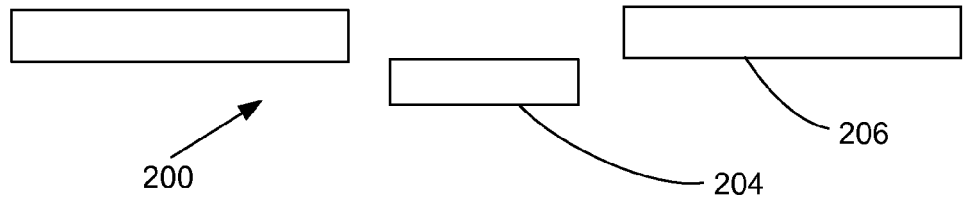
FIG. 2A is a diagrammatic side view of an example leadframe.
Figure 2B:
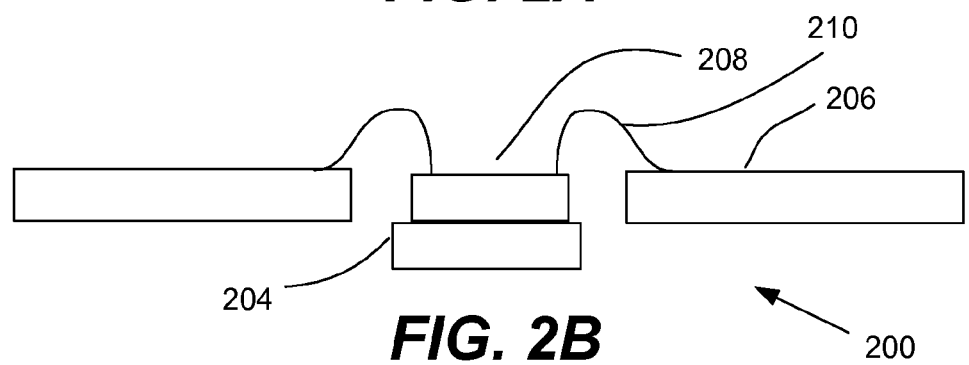
FIG. 2B is a diagrammatic side view of the leadframe of FIG. 2A after wirebonding and the attaching of an integrated circuit die.

FIGS. 2A-2I diagrammatically illustrate a process for forming an integrated circuit package similar to the one illustrated in FIG. 1. FIG. 2A presents a side view of leadframe 200 including die attach pad 204 and contact leads 206. In FIG. 2B, die 208 is added to die attach pad 204 and wirebonded to contact leads 206 using wires 210.

It should be appreciated that embodiments of the present invention contemplate a variety of arrangements of dice, contact leads, leadframes and/or leadframe-like structures. The techniques described herein, for example, may be applied to ball-grid arrays, leadless leadframes, thin foils and leadframes with or without die attach pads.

Figure 2C:
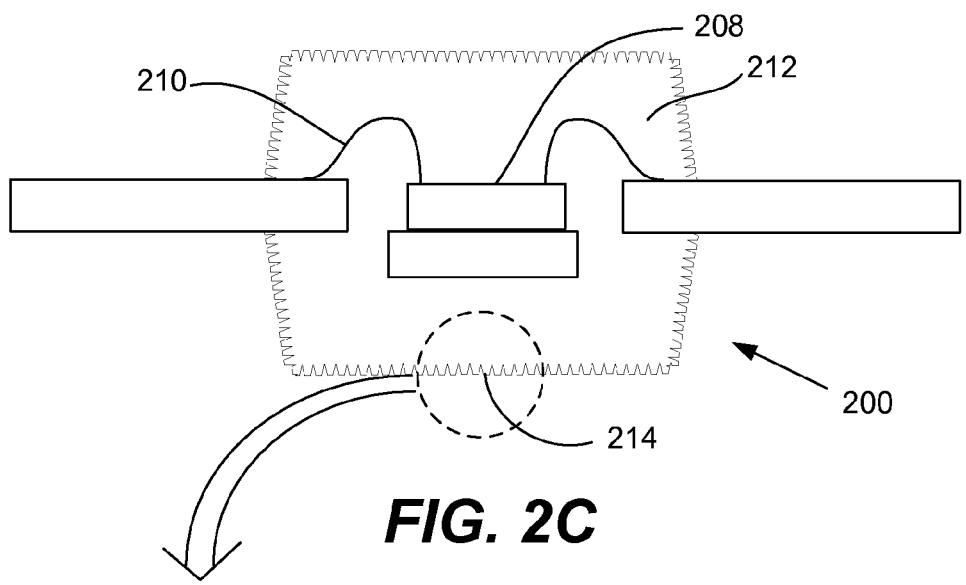
FIG. 2C is a diagrammatic side view of the die and leadframe of FIG. 2B after their encapsulation in a first plastic casing according to one embodiment of the present invention.

FIG. 2C diagrammatically illustrates a side view of the full encapsulation of die 208 and the partial encapsulation of leadframe 200 with first plastic casing 212. In the illustrated embodiment, plastic casing 212 was formed through transfer molding. As will be appreciated by those familiar with the art, in comparison to techniques such as injection molding, transfer molding can usually be performed under lower levels of pressure and temperature. As a result, transfer molding has a lower likelihood of damaging die 208 or dislodging wires 210. The first plastic casing includes a thermoset plastic material. The thermoset plastic material is designed to protect the die and wirebonds. In some embodiments of the present invention, the thermoset material has a glass transition temperature and cure temperature of no greater than approximately 175° C. The first plastic casing also includes a filler material made of small, rounded particles (not shown) that support the structural integrity of the casing while reducing the risk of damaging die 204. Any suitable molding technique, plastic material and/or filler material may be used.

FIG. 2C also illustrates small recesses 214 on the surface of first plastic casing 212. (Such recesses and other features presented in the drawings are meant to be illustrative and are not drawn to scale.) Recesses 214 facilitate the interlocking of first plastic casing 212 with another encapsulant, as will be described in greater detail below in connection with FIGS. 2G and 2H. These recesses may be formed in a variety of ways, such as knurling or molding. By way of example, a mold with a textured pattern may be filled with or pressed against molding material to form the recesses. Alternatively, the recesses could be formed through cutting or etching. The recesses may take a variety of forms, depending on the needs of a particular application.

Figure 2D:
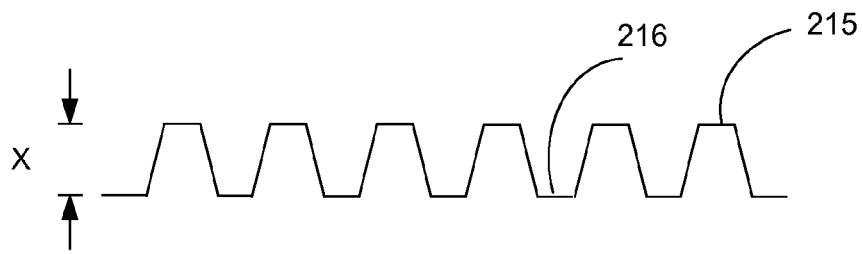
FIG. 2D is an enlarged view of the recesses on the surface of the plastic casing illustrated in FIG. 2C.

FIG. 2D illustrates a magnified side view of recesses 214, including recessed surfaces 216 and top surfaces 215. In the illustrated embodiment, the recesses define side profiles that are angular and tapered, although this is not a requirement. In some aspects of the invention, the depth of at least some of the recesses X is between approximately 0.2 and 0.3 millimeters. The recesses may define structures having a variety of shapes and dimensions.

Figure 2E:
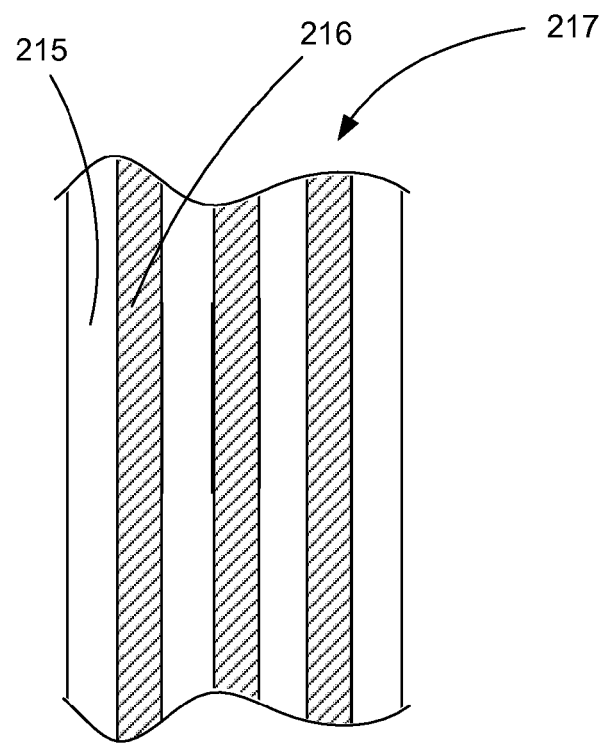
FIGS. 2E-2F are diagrammatic top views of example arrangements of the recesses illustrated in FIG. 2D.
Figure 2F:
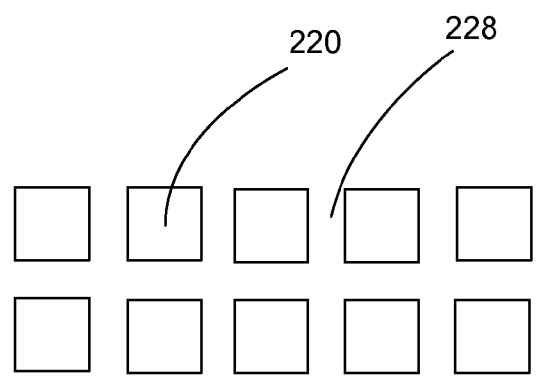

FIGS. 2E and 2F diagrammatically illustrate top views of two example arrangements. In the embodiment presented in FIG. 2E, the recesses define long slots or ridges. Ridges 215 extend from recessed surface 216. The recessed surface and the sides of the ridges form slots 217. FIG. 2F illustrates a different embodiment, in which the recesses define distinct pedestals 220 supported by a web 228. The illustrated pedestals have a square cross-section. Other shapes and arrangements are also possible.

FIGS. 2G and 2H diagrammatically illustrate the encapsulation of die 208 and first plastic casing 212 with second plastic casing 222 in accordance with one embodiment of the present invention. FIG. 2H provides an enlarged view of junction region 221 between first and second plastic casings 212 and 222. FIG. 2H shows how recesses 216 of first plastic casing 212 are filled with second plastic casing 222 having filler material 224.

In the illustrated embodiment, second plastic casing 222 includes a thermoplastic material. Preferably, the thermoplastic material has a melting point of greater than approximately 220° C. The thermoplastic material may help to insulate delicate components of the semiconductor package, such as the circuitry within the die, against heat, cold and other stresses. The second plastic casing, for example, could be made of a liquid crystal polymer, which is resistant to acids and temperature extremes. Liquid crystal polymers also have relatively low levels of water absorption and a low coefficient of thermal expansion (CTE).

In a preferred embodiment, the encapsulation of first plastic casing 222 is performed using injection molding. Injection molding typically involves heating the substance to be injected. Some aspects of the present invention take advantage of this heating process to more firmly secure the plastic casings to one another. By way of example, illustrated second plastic casing 222 includes a mixture of thermoplastic material and filler material 224 made at least partly of irregularly shaped, sharp edged particles. Filler material 224 has a glass transition temperature that is lower than that of the thermoplastic material. In some embodiments, for example, the thermoplastic material is a liquid crystal polymer and the filler material includes amorphous polymer chains, which have such properties. Prior to injection, the mixture of thermoplastic and filler materials is heated such that the filler material "softens." After the temperature of the mixture has increased further, the mixture is injected into recesses 216. Because of the "softening" of filler material 224, the filler material more easily flows into and conforms to recesses 216. Once temperatures decline sufficiently, the filler and thermoplastic material harden, thus forming a strong interlock with the first plastic casing. Additionally, the sharp edges of the hardened filler material help to anchor the filler material in the recesses.

The above features promote tight interlocking between the two plastic casings of a semiconductor package, which may improve the performance and reliability of the package. Delamination between layers of a semiconductor package occurs more easily if the connecting surfaces of the two layers are flat. Interlayer openings may allow moisture to penetrate the package. When temperatures rise, such moisture evaporates, creating substantial internal pressure that can damage the semiconductor package. The aforementioned recesses and interlocking features help minimize such problems.

FIG. 2I diagrammatically illustrates an optional step in forming a semiconductor package in accordance with one embodiment of the present invention. FIG. 2I shows the application of corrosion resistant coating 226 to the exterior surface of second plastic casing 222. Such coatings may be applied to the first plastic casing instead of or in addition to the second plastic casing. The coatings may enhance the resistance of the semiconductor package to corrosive elements such as sodium (Na) and chlorine (Cl) or substances such as acid. A wide variety of anti-corrosive coatings may be used.

Although only a few embodiments of the invention have been described in detail, it should be appreciated that the invention may be implemented in many other forms without departing from the spirit or scope of the invention. Encapsulation may be performed, for example, using processes other than transfer and injection molding. The described processes may be performed in a different order and a step in a process may be omitted. The slotting or indentations on the surface of the first plastic casing may be arranged in different ways or removed entirely. The filler materials in the two plastic casings may be removed or changed to include different types of particles. Preferably, the first and second plastic casings are made of thermoset plastic and thermoplastic materials, respectively, but other suitable types of materials may be used as well. Therefore, the present embodiments should be considered as illustrative and not restrictive and the invention is not limited to the details given herein, but may be modified within the scope and equivalents of the appended claims.

What is claimed is:

1. A semiconductor package comprising:
   a leadframe having a plurality of contact leads;
   a die electrically connected to the leadframe;
   a first plastic casing that encapsulates the die and at least a portion of the leadframe; and
   a second plastic casing encapsulating the first plastic casing, the second plastic casing having a different composition than the first plastic casing, wherein:
      the first plastic casing fully encapsulates the die and the second plastic casing fully encapsulates the first plastic casing;
      an outer surface of the first plastic casing includes a plurality of recesses and the second plastic casing substantially fills the recesses to help interlock the first and second plastic casings; and
      the second plastic casing includes a filler material having a glass transition temperature that is less than a glass transition temperature of the first plastic casing.

2. A semiconductor package as recited in claim 1 wherein the first plastic casing is formed from a thermoset plastic material and the second plastic casing is formed from a thermoplastic material.

3. A semiconductor package as recited in claim 2 wherein the first plastic casing is formed by transfer molding and the second plastic casing is formed by injection molding.

4. The semiconductor package of claim 3 wherein the thermoplastic material is a liquid crystal polymer with amorphous polymer chains.

5. A semiconductor package as recited in claim 1 wherein the recesses in the first plastic casing take the form of slots and wherein the slots are formed on all outer surfaces of the first plastic casing.

6. A semiconductor package as recited in claim 1 wherein a plurality of surfaces of the first plastic casing have knurled indentations that form the recesses in the first plastic casing.

7. The semiconductor package of claim 1 wherein the second plastic casing includes irregularly shaped filler materials that have a glass transition temperature that is less than a glass transition temperature of the second plastic casing.

8. The semiconductor package of claim 1, further comprising a corrosion resistant coating applied to an exterior surface of the second plastic casing.

9. The semiconductor package of claim 1 wherein the second plastic casing has a melting temperature of at least approximately 220° C.

10. The semiconductor package of claim 9 wherein the first plastic casing has a glass transition temperature that is no greater than approximately 175° C.

11. The semiconductor package of claim 1 wherein the first plastic casing includes a first plurality of filler particles and the second plastic casing includes a second plurality of filler particles and wherein some of the second plurality of filler particles has sharp edges.

12. The semiconductor package of claim 1 wherein the first plastic casing has been cured.

13. A semiconductor package comprising:
    a leadframe having a plurality of contact leads;
    a die electrically connected to the plurality of contact leads;
    a first plastic casing that encapsulates the die and at least a portion of the leadframe, the first plastic casing having a multiplicity of exterior surfaces, wherein each of a plurality of the multiplicity of exterior surfaces has a plurality of recesses; and
    a second plastic casing encapsulating the first plastic casing, the second plastic casing having a different composition than the first plastic casing and including a filler material having a glass transition temperature that is less than a glass transition temperature of the first plastic casing.

14. A semiconductor package as recited in claim 13 wherein the filler material in the second plastic casing includes particles having irregular shapes and sharp edges, the particles being sized to fit into the recesses in the exterior surfaces of the first plastic casing during molding of the second plastic casing.

15. A semiconductor package as recited in claim 14 wherein some of the filler particles in the second plastic casing are positioned within the recesses in the first plastic casing to improve the structural integrity of interlocking between the first and second plastic casings.

16. The semiconductor package of claim 13 wherein the recesses take the form of slots and the depth of the slots is in the range of approximately 0.2 to 0.3 millimeters.

17. The semiconductor package of claim 13 wherein the first plastic casing has been cured.

* * * * *